United States Patent [19]

Hamaguchi et al.

[11] 3,932,694

[45] Jan. 13, 1976

[54] PRE-TREATMENT METHOD FOR ELECTROLESS PLATING FOR PRODUCING A METAL FILM AS RESISTOR

[75] Inventors: Hachiro Hamaguchi, Nara; Hiroshi Takahama, Osaka, both of Japan

[73] Assignee: Tatsuta Densen Kabushiki Kaisha, Japan

[22] Filed: Apr. 4, 1974

[21] Appl. No.: 458,018

[52] U.S. Cl. .............. 428/432; 428/469; 427/305; 427/125
[51] Int. Cl.² .... B05D 5/12; B05D 3/04; B05D 3/10
[58] Field of Search .. 117/54, 123 B, 124 B, 160 R; 427/305, 125; 428/432, 469

[56] References Cited
UNITED STATES PATENTS

| | | |
|---|---|---|
| 2,702,253 | 2/1955 | Bergstrom ..................... 117/54 X |
| 3,105,772 | 10/1963 | Loiseleur ........................ 117/54 X |
| 3,138,479 | 6/1964 | Foley ............................... 117/54 X |
| 3,212,917 | 10/1965 | Tsu et al. ........................ 117/54 X |
| 3,393,737 | 7/1968 | Richardson .................... 117/54 X |
| 3,457,138 | 7/1969 | Miller ............................. 117/54 X |

*Primary Examiner*—Michael R. Lusignan
*Attorney, Agent, or Firm*—Wenderoth, Lind & Ponack

[57] ABSTRACT

A pre-treatment method for electroless plating of metal film resistors is provided. Said method is characterized in that a stabilized and uniform activating film is formed on the base material to be plated by sequential treatment of said base material with a stannous chloride ($SnCl_2$) solution, a silver salt solution, a second stannous chloride solution and a palladium, a palladium chloride ($PdCl_2$) solution. The resultant alloy film has improved resistance to exfoliation.

7 Claims, No Drawings

PRE-TREATMENT METHOD FOR ELECTROLESS PLATING FOR PRODUCING A METAL FILM AS RESISTOR

DETAILED DESCRIPTION OF THE INVENTION

This invention relates to a pre-treatment method for electroless plating a stable metal film resistor on the base material to be plated. Said method comprises causing a stabilized activating film to form on the base material to be plated, which film will not be exfoliated by washing in water or the like when the metal film resistor is deposited on base material e.g. ceramic or glass, by an electroless plating method.

Heretofore, in case of forming a metal film by the known pre-treatment in the known electroless plating method, firstly a base material (glass, ceramic, or the like), after degreasing and washing with water, was caused to adsorb tin by employing a stannous chloride solution. Secondly said base material was subjected to an activating pre-treatment with palladium by employing a palladium chloride solution. Lastly a metal film was caused to form on said base material by an electroless plating bath. However, the known method was useless to obtain a uniform and stabilized metal film as resistor of satisfactory properties. In order to overcome this difficulty, various kinds of electroless plating baths have been introduced but no satisfactory result has been achieved.

After a careful analytical study of the reason, the applicant has reached the conclusion that follows: after causing the base material to adsorb a stannous or palladium ion in the pre-treatment, said base material is subjected to a washing process, and during this washing process the adsorbed tin or palladium is detached from the base material, whereby uniformity of the activating film is lost. To be more precise, in the case of electroless plating without the objective of producing resistance, thick plating is desired and therefore irregularity of the activating film and the like hardly has a serious effect on the properties of the product. On the other hand, if the objective is to produce resistance, unevenness of the activating film will pose a serious problem because a thin, extremely uniform film is required in that case.

After careful studies based upon the foregoing concept and with the aim of obtaining an activating film undetachable from the base material during washing in water, applicant has ascertained the fact that a stabilized and uniform activating film suitable for electroless plating of a resistance film can be obtained by employing a silver mirror reaction during the pre-treatment. For example, prior to the known method of electroless plating pre-treatment in which a base material to be plated is sensitized by submerging it in a stannous chloride solution, washed in water, and then activated by submerging it in a palladium chloride solution, this invention has introduced an additional step in which the base material is first treated with a stannous chloride solution, washed in water, and then subjected to a treatment with a silver salt solution so as to produce a silver mirror reaction. Needless to say, the addition of the silver mirror reaction is not restricted to the order mentioned, viz., there can be a variation in the order of the combination of the treatments by the stannous chloride solution, silver salt solution and palladium chloride solution.

Thus a highly stabilized and uniform activating film can be produced on the base material which is free from detachment during washing in water or the like. An extremely uniform and stabilized film as resistor is obtainable by subjecting said base material to the electroless plating according to the known method.

The effect of this invention will now be described in detail in reference to an example. Firstly, as a sensitizing solution is used an aqueous solution comprising stannous chloride and hydrochloric acid, for example, an aqueous solution is prepared by adding 5 g of stannous chloride and 10' cc of hydrochloric acid to 1 liter of water. Next, the silver solution for causing a silvered mirror reaction is prepared by making use of silver salts, such as silver nitrate ($AgNO_3$), silver chloride and the like, for example, an aqueous solution prepared by dissolving 5 g of silver nitrate in 1 liter of water and then adding a small amount of ammonia water thereto.

The activating solution is an aqueous solution comprising palladium chloride and hydrochloric acid, for example, 5 g of palladium chloride is heated and dissolved with 5 cc of hydrochloride acid, a dilute solution being prepared by adding 0.2 cc of the resultant solution to 1 liter of water. These pre-treatment solutions are required, for obtaining desirous results, to be treated in temperature ranging from 15°C to 50°C and more preferably from 20°C to 30°C. Time required for the treatment ranges from 1 to 10 minutes and preferably 3 - 5 minutes.

The present invention is applicable to electroless plating of the nickel-cobalt or nickel-chromium system.

The electroless plating bath comprises, for example, a composition as mentioned hereinunder.

| | |
|---|---|
| $NiSO_4.6H_2O$ | 3 (g/l.) |
| $CoSO_4.7H_2O$ | 30 (g/l.) |
| $Na_2C_4H_4O_5.1/2 H_2O$ | 30 (g/l.) |
| $Na_3C_6H_5O_7.2H_2O$ | 180 (g/l.) |
| $NaH_2PO_2.H_2O$ | 50 (g/l.) |
| pH | 10 |
| Temparature | 30 (°C) |
| Plating Time | 8 (Minutes) |
| Base Material | 4.5$\phi$ × 14 mm forsterite. |

The following table shows the result of comparison between the properties of each resistor produced by the conventional pre-treatment and the method of this invention.

| CONVENTIONAL METHOD Pre-Treatment | | | Short-time Overload Test | | (Testing Method: JIS C 6402) Pulse Test | | Endurance Test | |
|---|---|---|---|---|---|---|---|---|
| Sensitization | Activation | Electroless Plating | Finished Product Resistance Value (KΩ) | Variation Rate (%) | Finished Product Resistance Value (KΩ) | Variation Rate (%) | Finished Product Resistance Value (KΩ) | Variation Rate (%) |
| Washing | Washing | Washing Ni-CO electroless plating | 101.8 99.9 102.4 101.4 | +2.88 Burn damage Burn damage +20.90 | 256.2 256.2 242.1 260.3 | Burn damage Burn damage Burn damage Burn damage | 965.0 985.4 1000.1 993.4 | ∞ ∞ +47.20 ∞ |
| $SnCl_2$ solution | $PdCl_2$ solution | | | | | | | |

-continued

| CONVENTIONAL METHOD Pre-Treatment | | | Short-time Overload Test | | (Testing Method: JIS C 6402) Pulse Test | | Endurance Test | |
|---|---|---|---|---|---|---|---|---|
| Sensitization | Activation | Electroless Plating | Finished Product Resistance Value (KΩ) | Variation Rate (%) | Finished Product Resistance Value (KΩ) | Variation Rate (%) | Finished Product Resistance Value (KΩ) | Variation Rate (%) |
| | | solution | 100.4 | +50.00 | 265.3 | Burn damage | 981.0 | +39.40 |

METHOD OF THIS INVENTION

| Sensitization | Silvered Mirror Reaction | Pre-Treatment Washing Sensitization | Activation | Electroless Plating |
|---|---|---|---|---|
| SnCl$_2$ Solution | Ag Solution | SnCl$_2$ Solution | PdCl$_2$ Solution | Ni-Co Electroless Plating Solution |

METHOD OF THIS INVENTION

| Short-time Overload Test | | (Testing Method: JIS C 6402) Pulse Test | | Endurance Test | |
|---|---|---|---|---|---|
| Finished Product Resistance Value (KΩ) | Variation Rate (%) | Finished Product Resistance Value (KΩ) | Variation Rate (%) | Finished Product Resistance Value (KΩ) | Variation Rate (%) |
| 99.9 | +0.06 | 263.7 | −0.04 | 980.6 | +0.30 |
| 100.1 | +0.03 | 263.2 | −0.05 | 1006.6 | 0 |
| 100.1 | +0.02 | 266.5 | −0.07 | 976.7 | +0.20 |
| 99.6 | +0.01 | 264.3 | −0.08 | 982.4 | +0.20 |
| 98.5 | +0.01 | 263.2 | −0.05 | 990.2 | +0.10 |

As is clear from the above example, the pre-treatment of this invention enables one to obtain resistor of far better properties than those of the conventional processes.

What is claimed is:

1. A method for forming metal film resistor on non-metallic substrate by means of electroless plating, wherein said substrate is sequentially pre-treated with a first stannous chloride solution, silver salt solution, a second stannous chloride solution and further with palladium chloride solution and then forming a metal film resistor on said pre-treated substrate by electroless plating.

2. A method according to claim 1 wherein glass or ceramic is used as the nonmetallic substrate.

3. A method according to claim 2 wherein the silver salt is AgNO$_3$ or AgCl.

4. A method according to claim 3 wherein the silver salt solution contains a small amount of ammonia water therein and the silver salt is AgNO$_3$ at a concentration of about 5g/l.

5. The glass or ceramic substrate pre-treated by the method of claim 1.

6. A method according to claim 1 wherein nickel-cobalt alloy or nickel-chrome alloy is the metal which is electrolessly plated.

7. Metal film resistors produced by means of electroless plating according to the method of claim 6.

* * * * *